United States Patent [19]

Guzik

[11] Patent Number: 5,254,946
[45] Date of Patent: Oct. 19, 1993

[54] MAGNETIC HEAD AND DISK TESTER WITH HEAD CENTRALLY MOUNTED ON RADIALLY-MOVING, ROTATABLE PLATFORM THAT SURROUNDS DISK

[75] Inventor: Nahum Guzik, Palo Alto, Calif.

[73] Assignee: Guzik Technical Enterprises, Inc., San Jose, Calif.

[21] Appl. No.: 840,527

[22] Filed: Feb. 25, 1992

[51] Int. Cl.$^5$ ............................................. G01R 33/12
[52] U.S. Cl. ..................................... 324/262; 360/75;
360/109; 360/137; 324/212
[58] Field of Search ................. 324/212, 262; 360/106,
360/75; 369/222, 250, 265

[56] References Cited

U.S. PATENT DOCUMENTS

| | | | |
|---|---|---|---|
| 3,962,724 | 6/1976 | Koizumi | 360/31 |
| 4,896,233 | 1/1990 | Yamada | 360/104 |
| 4,902,971 | 2/1990 | Guzik et al. | 324/212 |
| 5,032,942 | 7/1991 | Kurosawa et al. | 360/109 |
| 5,126,905 | 6/1992 | Nomura et al. | 360/105 |

Primary Examiner—Aristotelis Psitos
Assistant Examiner—James L. Habermehl
Attorney, Agent, or Firm—David Pressman

[57] ABSTRACT

A positioning device includes a base platform (100) which bears linear slide mechanisms (102 and 104). Stationary shafts (106 and 108) of the slide mechanisms are rigidly attached to the base platform. Sliding bushings (110 and 112) are mounted into a movable housing (124) whose motion is governed by a first stepper motor (136). The translation range of the housing is limited by a stop post (148) mounted onto the base platform. The housing supports a ball bearing (130), which comprises an outer race (132) and an inner race (134). The inner race is rigidly attached to the housing. The outer race supports a rotatable platform (150). The rotational motion of the outer race of the bearing is governed by a second stepper motor (154). The rotatable platform bears a mechanical arm (172) which holds a transducing head (180) centrally disposed with respect to the bearing. The transducing head can be placed at any desired radial position with respect to a disk (168) which is mounted onto a spindle (162) by imparting a specified displacement to the slider mechanisms via the first stepper motor. The necessary angular orientation of the transducing head with respect to the disk can be achieved by rotating the ball bearing via the second stepper motor.

16 Claims, 6 Drawing Sheets

MAGNETIC HEAD AND DISK TESTER WITH HEAD CENTRALLY MOUNTED ON RADIALLY-MOVING, ROTATABLE PLATFORM THAT SURROUNDS DISK

BACKGROUND—FIELD OF INVENTION

The present invention relates to magnetic read-write heads and magnetic disks, particularly to an improved tester for read-write heads and magnetic disks.

BACKGROUND—DESCRIPTION OF PRIOR ART

For a better understanding of the terminology used in the specification, it will be helpful to describe the structure of a typical computer disk drive.

An example of a known computer disk drive is shown schematically in FIG. 1. A magnetic disk 10 has a plurality of concentric magnetic tracks of uniform width, such as an outer track O and an inner track I. Disk 10 is mounted onto a spindle 12 by means of a known disk holder (not shown). Spindle 12 rotates disk 10 at a high speed when the drive is in operation.

A pivoting arm 14, with a pivot pin 16 as its fulcrum, holds a read-write magnetic (transducing) head 18 next to the surface of disk 10. Generally, head 18 is supported on a thin cushion of air which is created by the rotation of the disk. During contact recording, however, head 18 may touch the surface of disk 10.

Head 18 incorporates a magnetic read-write element 20, which is positioned at the trailing edge of the head. During magnetic recording, element 20 writes information to and reads information from specified tracks on disk 10. A known rotary actuator (not shown) pivots arm 14 to move element 20 of the transducing head from one track to another, e.g., from track O to track I. During such pivoting of arm 14, the path of element 20 follows an arc C.

When element 20 is positioned at track O and a tangent line $T_o$ is drawn at the point of intersection between track O and the longitudinal axis L of element 20 (which is parallel to the longitudinal axis of head 18), an angle $A_o$ is formed between axis L and line $T_o$.

Similarly, when element 20 is positioned at track I and a tangent $T_i$ is drawn at the point of intersection between track I and axis L, an angle $A_i$ is formed between axis L and line $T_i$.

Angles, such as $A_o$ and $A_i$, formed between the longitudinal axis of read-write element 20 and a tangent to a track where element 20 is positioned, are called skew angles. The skew angles of transducing head 18 are different at every track of the magnetic disk and may, in fact, have opposite signs.

The read-write parameters of the disk drive depend on the spacing between the head and the disk. This spacing is a function of the angular orientation of the head in an airstream, which is created by the rotation of the disk, and the radial position of the head with respect to the center of the disk. It is essential to duplicate the angular and radial positions of the head with respect to the disk for purposes of accurate magnetic-head and disk testing as well as for flying-height (head and disk separation) testing.

One known magnetic head and disk tester, disclosed in U.S. Pat. No. 4,902,971 to Guzik et al., employs the positioning apparatus shown in FIG. 2. The apparatus comprises a stationary base 22, a slide mechanism 24, and an arm 46 which is pivotally supported on a slide 36 of the slide mechanism. A transducing head 52 to be tested is attached to the end of arm 46. The angular displacement of the longitudinal axis of the magnetic head's read-write element with respect to a tangent to a given track of a magnetic disk D, i.e., the skew angle of the head, can be changed and the head can be fixed in the desired position. For measuring the parameters of the head and the disk, the angular position of arm 46 is adjusted to produce the required skew angles, and slide 36 moves linearly and carries the magnetic head over the disk in a linear path from an inner track ID to an outer track OD.

However, while a valuable improvement over prior-art testers, this positioning apparatus does not have optimal accuracy. Since the apparatus approximates the curved trajectory of a transducing head of an actual drive by a linear path, the tester duplicates skew angles only for two tracks, e.g., tracks ID and OD. The skew angles for all the other tracks are approximated with some error. Moreover, the apparatus is not maximally convenient for flying-height measurements since the optical system of the tester would have to be repositioned every time arm 46 is rotated to change the skew angles of the head. Readjustments of the optical system would make flying-height measurements cumbersome and inexpedient.

Positioning mechanisms employing linear X-Y manipulators are also utilized in the field of magnetic head and disk testing. These mechanisms use separate sliders with computer-controlled drives on X and Y axes. The main drawback of X-Y positioning mechanism is the complexity of the geometrical path over which the head travels across the surface of the disk. Because of this, no simple mechanical provisions exist to prevent the head from crashing into the hub of the hard disk spindle.

OBJECTS AND ADVANTAGES

It is accordingly an object of the invention to provide a positioning device for magnetic head and disk testers and flying-height testers, which simulates skew angles of the transducing head without error, which translates the transducing head in a simple radial path with respect to the disk, which has a simple mechanical means to prevent crashes of the transducing head, which is rigid, which expedites flying-height testing, and which is convenient, accurate, and reliable in operation. Further objects and advantages will become apparent after consideration of the ensuing description and the accompanying drawings.

DRAWING FIGURES

Figure 1:
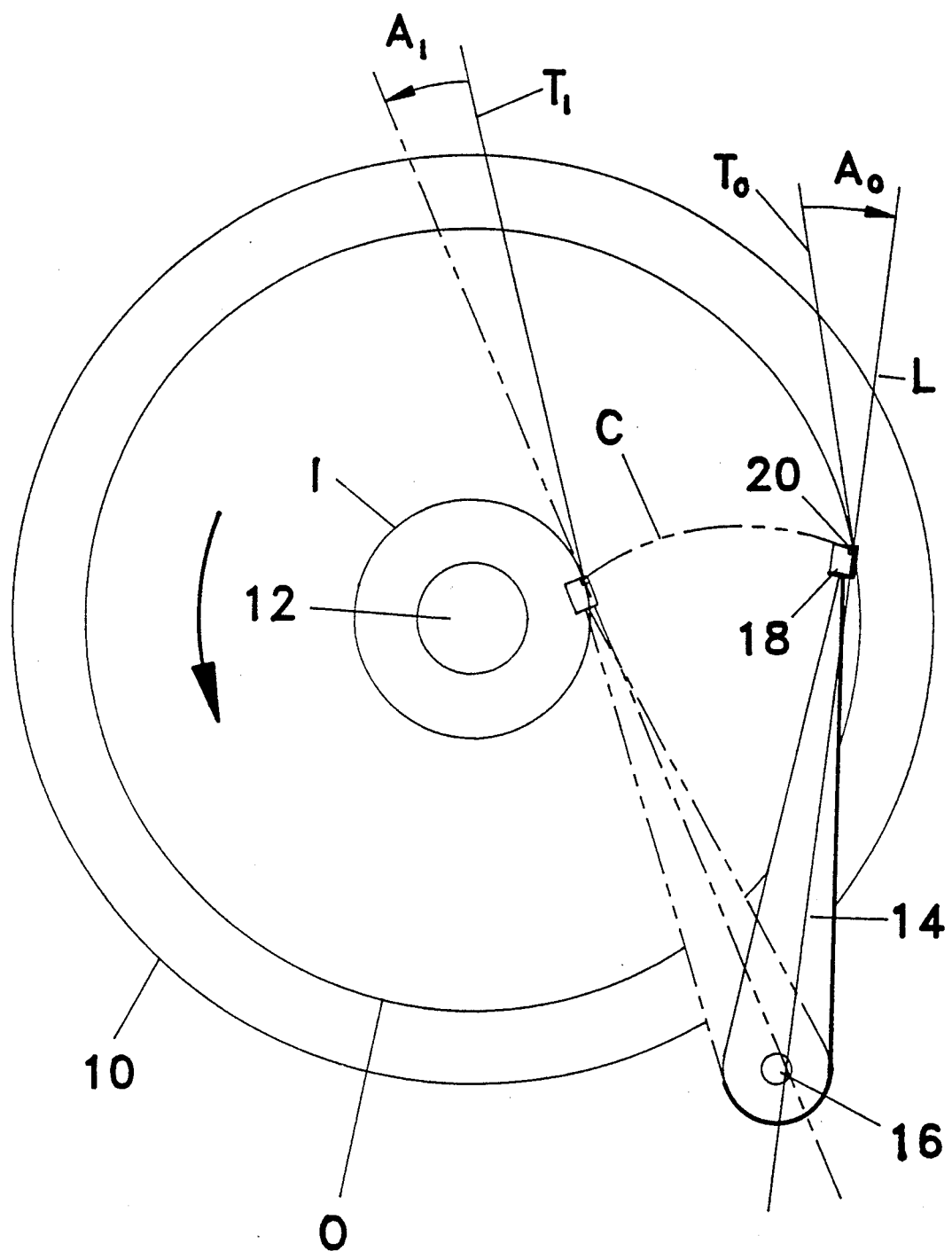
FIG. 1 is a schematic drawing of a prior-art disk drive.
Figure 2:
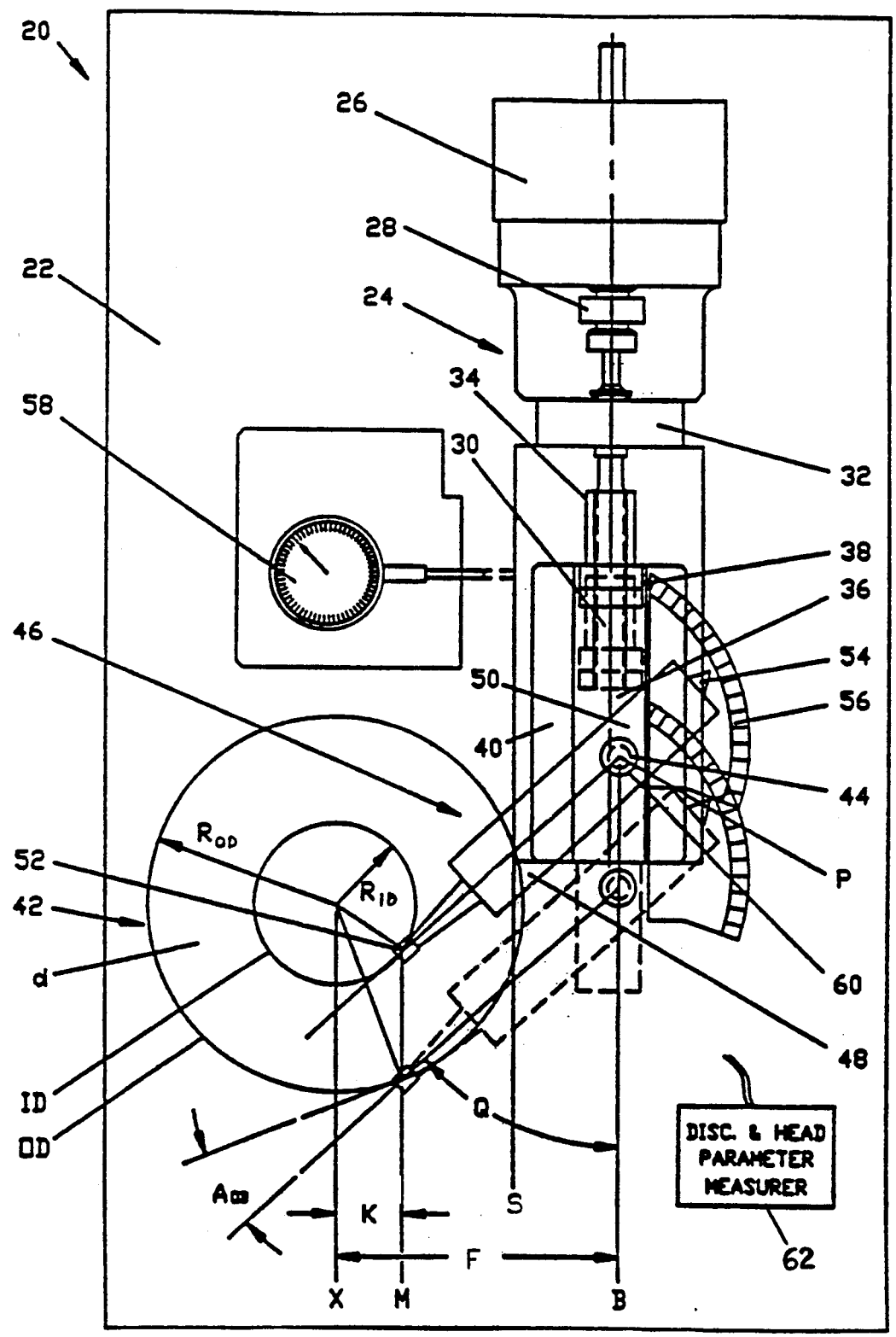
FIG. 2 is a schematic representation of a prior-art magnetic head and disk tester.

For purposes of illustration, these figures are not necessarily drawn to scale.

REFERENCE CHARACTERS USED IN THE DRAWINGS AND DESCRIPTION

A—initial distance
C—arc trajectory
L—longitudinal axis
P—radial path
R—magnetic track
α—skew angle
$A_o$, $A_I$—skew angles
$T_o$, $T_I$—tangent lines
O, OD—outer magnetic tracks
I, ID—inner magnetic tracks
10—magnetic disk
12—spindle
14—pivoting arm
16—pivot pin
18, 52, 180—transducing heads
20, 184—magnetic read-write elements
22—stationary base
24—slide mechanism
36—slide
46—arm
100—base platform
102, 104—linear slide mechanisms
106, 108—shafts
110, 112—sliding bushings
114, 116, 118, 120, 140—uprights
122, 142, 146, 156—screws
124—movable housing
126—annular shoulder
128—threaded insert
130—ball bearing
132—outer race
134—inner race
136, 154—stepper motors
138—lead screw
144—bracket
148—vertical stop post
150—rotatable platform
152—gear segment
158—output shaft
160—circular gear
162—spindle
164—rotary drive unit
166—circular opening
168—magnetic disk
170—disk holder
172—mechanical arm
174—thumb screw
176, 178—dowel pins
180—transducing head
182—flexure
184—magnetic read-write element

FIGS. 3 THROUGH 6

Description

Positioning Device for Magnetic-Head and Disk Testers

Figure 3:
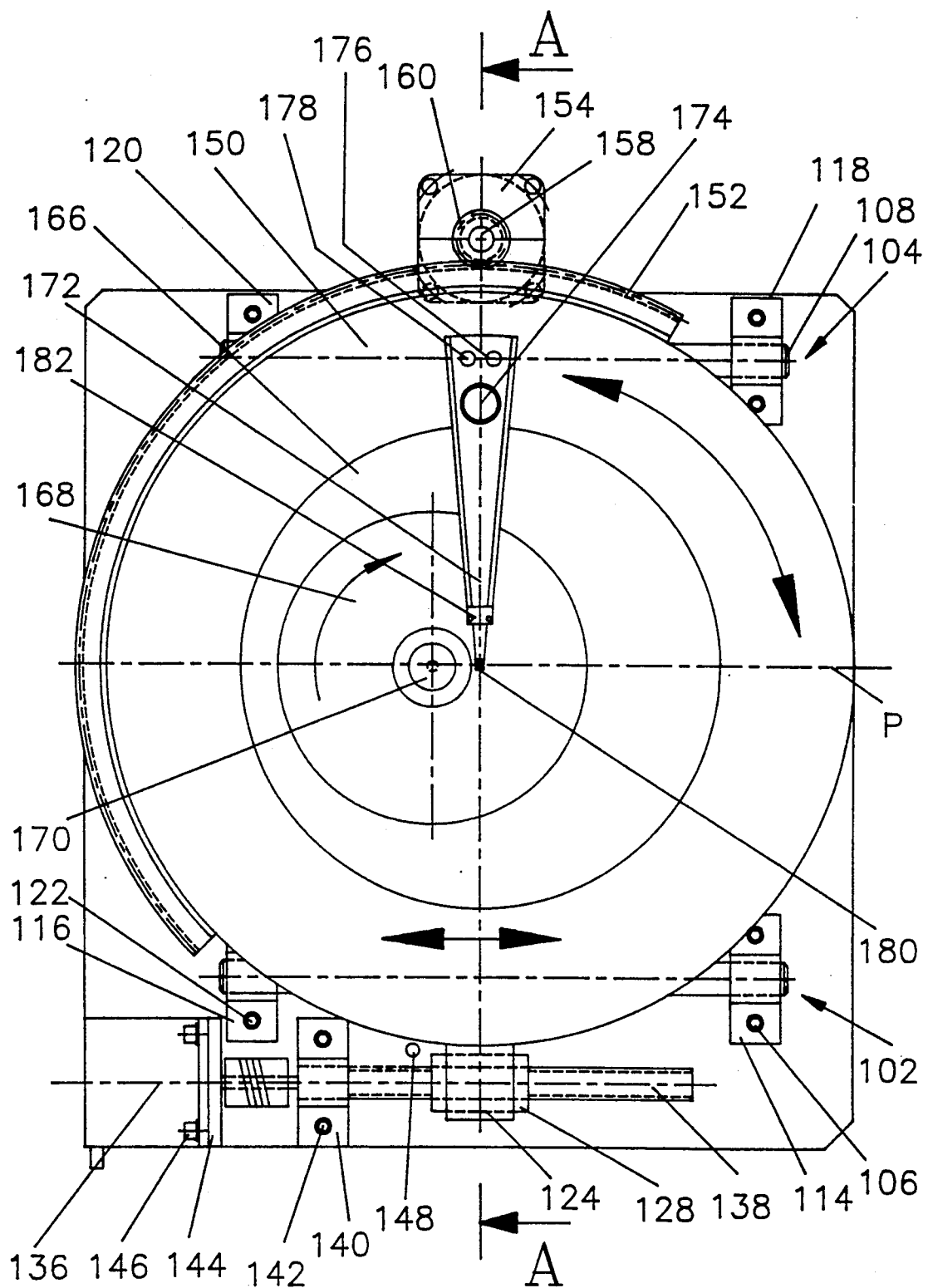
FIG. 3 is a plan view of a transducing head positioning device according to the invention.

A plan view of a positioning device for magnetic-head and disk testers and flying-height testers according to the present invention is shown in FIG. 3.

Figure 4:
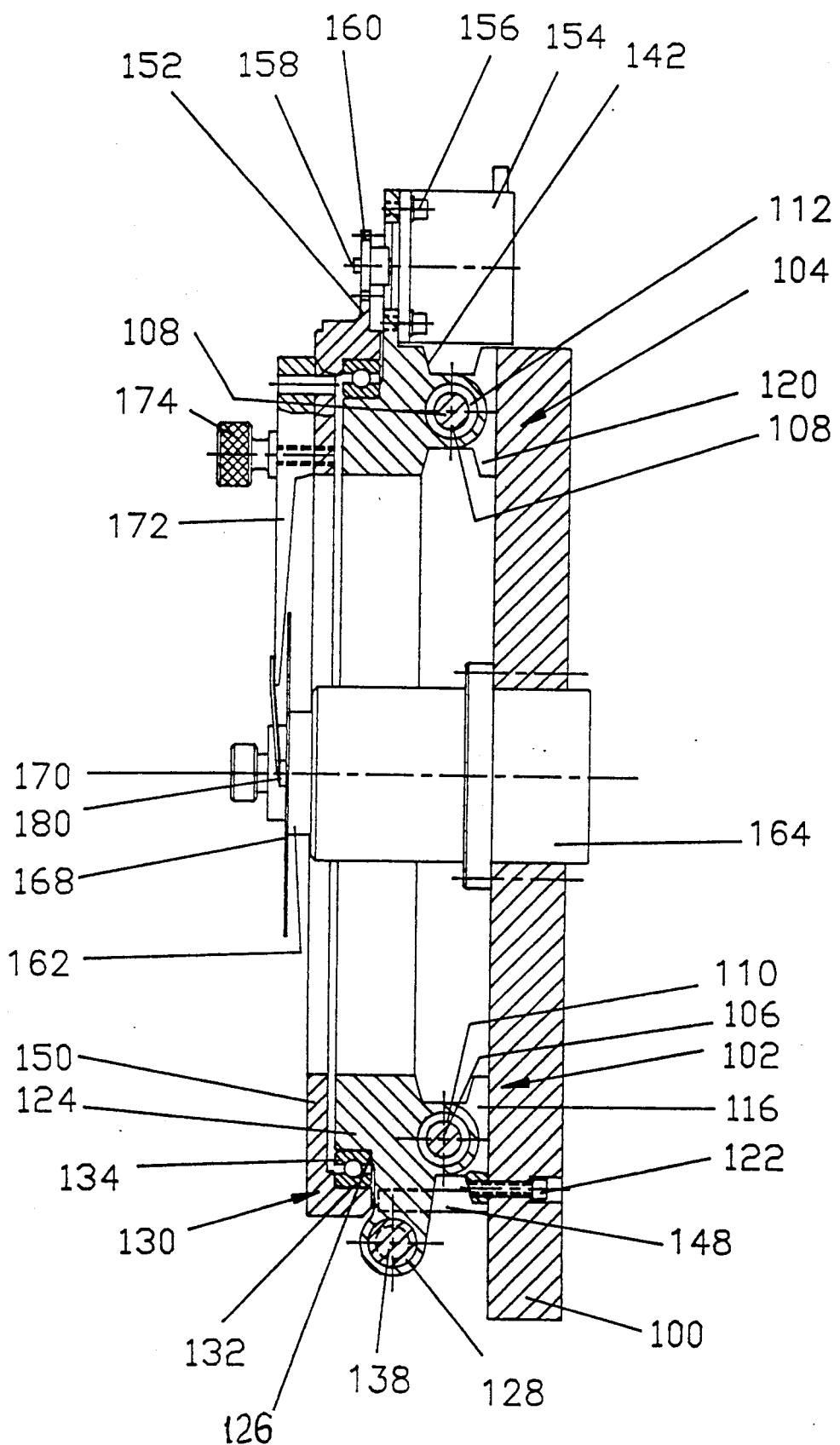
FIG. 4 is a cross-sectional view taken along line A—A of FIG. 3.

FIG. 4 shows a cross-sectional view along line A—A of FIG. 3.

The device has a base platform 100 which bears two linear slide mechanisms 102 and 104. Mechanisms 102 and 104 include shafts 106 and 108, and sliding bushings 110 and 112, respectively. Shafts 106 and 108 are supported by uprights 114, 116, 118, and 120, which are rigidly attached to platform 100 with threaded fasteners, such as a screw 122 (FIG. 3). Bushings 110 and 112 are installed into a movable housing 124, which also comprises an annular shoulder 126 and a threaded insert 128.

A ball bearing 130, having an outer race 132 and an inner race 134, is mounted onto shoulder 126 so that bearing 130 and housing 124 comprise an integral movable unit. A stepper motor 136 engages insert 128 through a lead screw 138 (FIG. 3). Screw 138 is rotatingly supported by an upright 140, which is anchored to platform 100 with threaded fasteners, such as screw 142 (FIG. 3). Motor 136 is secured to platform 100 by means of a bracket 144 and threaded fasteners, including a screw 146 (FIG. 3).

The translational range of bushings 110 and 112 is limited by a vertical stop post 148 which is threaded into platform 100 and which engages housing 124.

Race 132 of the ball bearing supports a rotatable platform 150 incorporating a gear segment 152, which is situated at the periphery of platform 150. The angular motion of platform 150 is regulated by a stepper motor 154 bolted to housing 124 with threaded fasteners, including a screw 156. An output shaft 158 of motor 154 is coupled to a circular gear 160 which engages gear segment 152.

A spindle 162, coupled to a rotary drive unit 164, is supported by platform 100. The rotational axis of spindle 162 intersects the radial path P of the rotational axis of bearing 130 (FIG. 3). Spindle 162 is located inside a circular opening 166, which is formed in the interior of housing 124 (FIG. 3). Spindle 162 supports a magnetic disk 168 which is mounted onto the spindle by means of a disk holder 170. For purposes of flying-height measurements, a transparent disk (not shown) is utilized instead of a magnetic disk.

Figure 6:
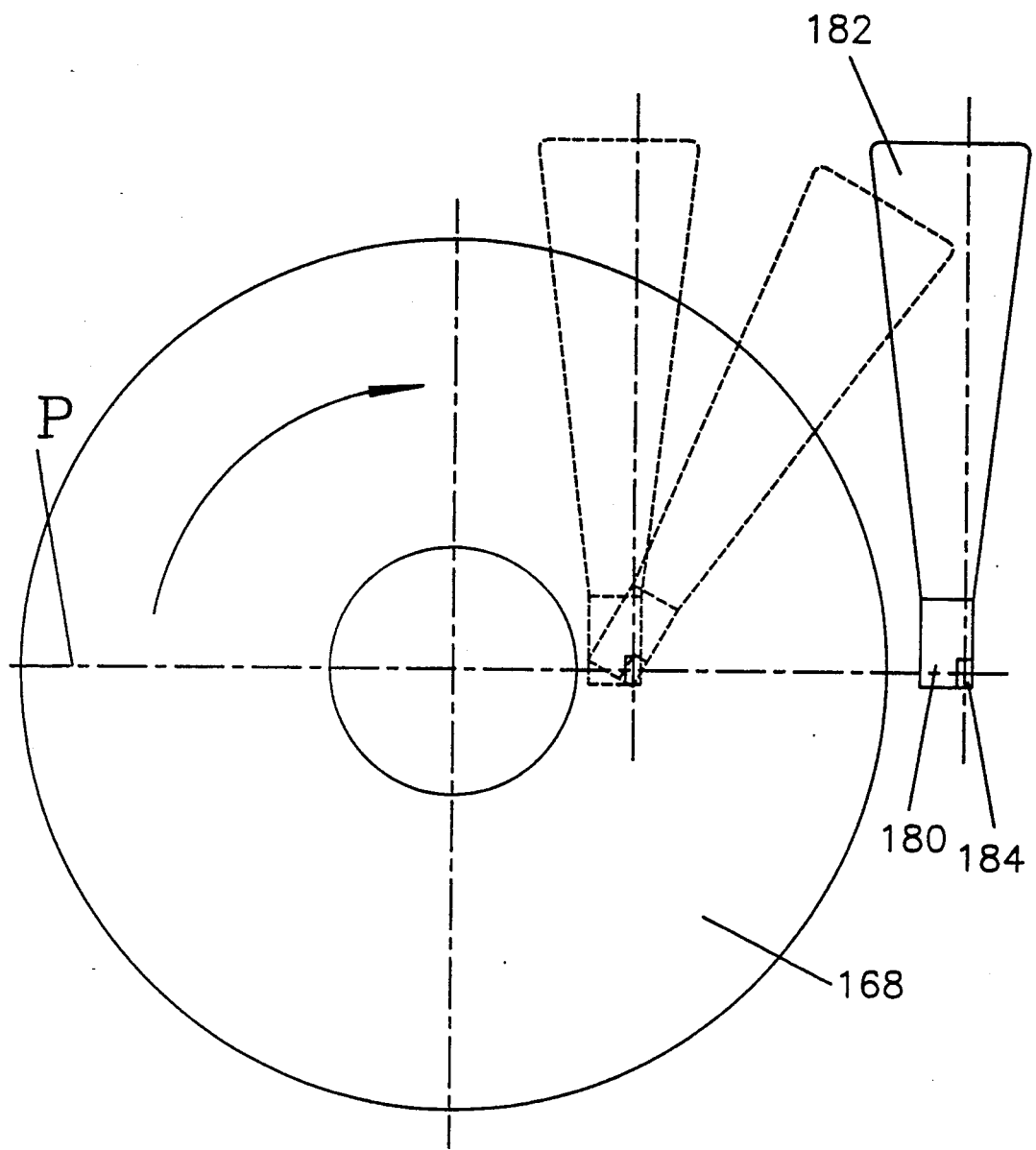
FIG. 6 is a close-up showing a detail of the device depicted in FIG. 5.

Platform 150 bears a mechanical arm 172 attached to the platform with quick-release fasteners, including a thumbscrew 174 and dowel pins 176 and 178 (FIG. 3). Arm 172 carries a transducing head 180 having a flexure 182, which comprises a flexible metal strip. Head 180 incorporates a magnetic read-write element 184 (FIG. 6). Flexure 182 is attached to arm 172 with an adjustable clamp (not shown) so that element 184 is positioned along the rotational axis of bearing 130, i.e., centrally with respect to the bearing.

Bearing 130 may have a diameter of approximately 30 cm and can rotate approximately 60°. Slider mechanisms 102 and 104 should provide about 10 cm of linear motion.

FIGS. 3 THROUGH 6

Operation

Figure 5:
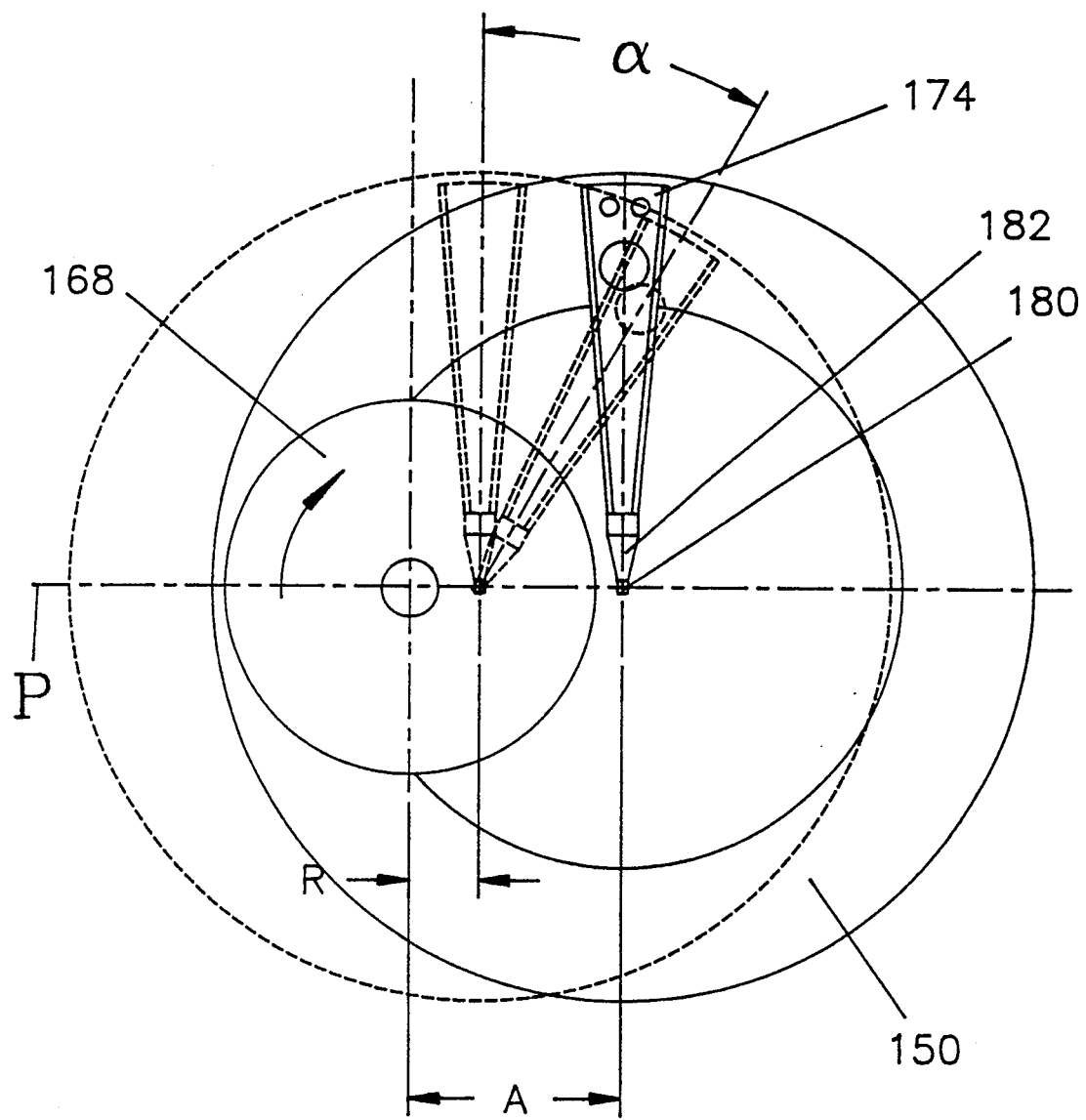
FIG. 5 is a plan view illustrating translational and rotational motion of the positioning device shown in FIG. 3.

FIG. 5 illustrates the operation of the positioning device.

In order to accurately test read-write or flying-height parameters of a disk drive, the input data consisting of the radius of a track R and the value of a corresponding skew angle α is first specified according to the physical properties of an actual drive to be tested.

Initially, head 180 is positioned a known distance A away from the center of disk 168 such that distance A is greater than the radius of the disk. The angular position of head 180 with respect to disk 168 is also known. Disk 168 is rotated at a high speed by spindle 162.

Motor 136 then rotates lead screw 138, which in turn engages insert 128 of housing 124, thereby translating housing 124, bearing 130, platform 150, and arm 172 as a unit. Read-write element 184 of transducing head 180 travels towards disk 168 along a radial path P (FIGS. 5 and 6).

As head 180 approaches the circumference of disk 168, a conventional lifting mechanism (not shown) deflects flexure 182 to prevent head 180 from contacting disk 168. Once head 180 is positioned near the working surface of disk 168, an air cushion created by the high-speed rotation of the disk prevents contact between the head and the disk.

The displacement that motor 136 imparts to transducing head 180 is such that read-write element 184 of the head is positioned at the radius of track R specified in the input data.

Once the desired radial position of head 180 with respect to disk 168 has been achieved, motor 154 rotates gear 160 which engages gear segment 152. Platform 150 and head 180, supported thereon, are rotated through the angular displacement, i.e., skew angle α, specified in the input data. Thus, the correct orientation of the transducing head with respect to a given magnetic track of the disk is achieved for testing purposes.

The above steps may be utilized to simulate the working conditions of an actual disk drive for any set of input data consisting of a track radius and a corresponding skew angle.

Furthermore, since head 180 always translates in a radial path with respect to disk 168, stop post 148 simply and effectively prevents the head from crashing into spindle 156. If necessary, post 148 may be relocated so that the positioning device can accommodate disks having different inside diameters.

Moreover, radial motion of head 180 greatly expedites flying-height testing, since the optical system (not shown) of a flying-height tester does not have to be readjusted for different sets of the aforementioned input data.

SUMMARY, RAMIFICATIONS, AND SCOPE

Thus, it has been shown that I have provided a greatly improved positioning device for magnetic-head and disk testers. The device simulates skew angles of the transducing head without error, translates the head in a simple radial path with respect to the disk, has a simple mechanical means to prevent crashes of the transducing head, expedites flying-height testing, and provides additional rigidity. Moreover, the positioning device is uncomplicated, accurate, and reliable in operation.

Although the positioning device has been shown and described in the form of a specific embodiment, its parts, materials, and configurations are given only as examples, and many other modifications of the apparatus are possible. For example, housing 124 may incorporate a switch which turns off the motor when the housing contacts stop post 148. Moreover, to move the transducing head to a required track on the disk, head 180 may be held stationary while the spindle mechanism is linearly translated on sliders. Furthermore, stepper motor 154, which controls the angular position of the transducing head, may be eliminated and head 180 may be manually positioned with a pointer and a scale. Sliding bushings 110 and 112 and shafts 106 and 104 may be replaced with dovetail sliders or roller-type sliding mechanisms. During magnetic head and disk testing, the positioning device may be used to position a stack of transducing heads over a stack of magnetic disks. Therefore, the scope of the invention should be determined, not by the examples given, but by the appended claims and their legal equivalents.

What I claim is:

1. A magnetic head and disk tester comprising:
   a first body having an axis of rotation and a flat surface, said flat surface being orthogonal to said axis of rotation;
   a second body positioned near said flat surface of said first body, said second body having an area of interest;
   spinning means for rotating said first body around said axis of rotation;
   rotary means for angularly positioning said second body with respect to said first body, said rotary means having an axis of rotation;
   translating means for linearly moving said second body in a radial path with respect to said first body, said rotary means being supported by said translating means;
   supporting means for supporting said translating means; said first body being selected from the group consisting of magnetic disks and transparent disks;
   said second body being a transducing head of a computer disk drive, said area of interest being a magnetic read-write element;
   said read-write element being centrally positioned with respect to said rotary means.

2. The tester of claim 1 wherein said spinning means comprises a spindle assembly.

3. The tester of claim 2 wherein said rotary means comprises a bearing having a rotary drive mechanism, said bearing including an outer race and an inner race, said inner race circumscribing a region, said spindle assembly being located inside said region and having a hub.

4. The tester device of claim 3 wherein said translating means comprises a sliding mechanism, said sliding mechanism having a housing, a plurality of stationary shafts, a plurality of sliding bushings, and a drive mechanism.

5. The tester of claim 4, wherein said inner race of said bearing is rigidly attached to said housing, said outer race of said bearing being rotatable with respect to said inner race.

6. The tester of claim 4, further including safety means for preventing contact between said second body and said spinning means.

7. The tester of claim 6 wherein said safety means comprises a stop post positioned to engage said housing before said second body contacts said hub of said spindle assembly, said stop post being rigidly mounted onto said supporting means.

8. The tester of claim 3 wherein said rotary means further includes a rotatable platform rigidly attached to said outer race of said bearing.

9. The tester of claim 8, further including holding means for supporting said second body, said holding means being rigidly and removably attached to said rotatable platform.

10. The tester of claim 9 wherein said holding means comprises a mechanical arm.

11. A magnetic head and disk tester, comprising:
    a test object having an axis of rotation and a flat surface, said flat surface being orthogonal to said axis of rotation;

a transducing head of a computer disk drive, said transducing head having a magnetic read/write element, said transducing head being positioned near said flat surface of said test object;

a spindle assembly supporting said test object;

a bearing having an axis of rotation, an inner race, an outer race, and a rotary drive unit, said magnetic read-write element of said transducing head being positioned so that said axis of rotation of said bearing passes through said read-write element, said inner race circumscribing a region, said spindle assembly being located inside said region, said axis of rotation of said bearing having a translational path;

a rotatable plate rigidly attached to said outer race of said bearing;

an arm supported by said rotatable plate, said transducing head being attached to said arm;

a linearly movable housing comprising a plurality of stationary shafts, a plurality of sliding bushings, and a drive unit, said inner race of said bearing being rigidly connected to said linearly movable housing, said translational path of said axis of rotation of said bearing being radial with respect to said test object;

a stop post limiting the linear range of travel of said transducing head, said stop post engaging said linearly movable housing; and a platform which supports said linearly movable housing, said spindle assembly, and said stop post.

12. The tester of claim 11 wherein said test object is selected from the group consisting of magnetic disks and transparent disks.

13. A method of positioning a magnetic read-write head with respect to a test disk so that magnetic and aerodynamic properties of said head can be evaluated, said head having an area of interest, said test disk having a flat surface and an axis of rotation, said method comprising the steps of:

specifying a desired radial position and a desired angular orientation of said head with respect to said test disk;

rotatingly supporting said test disk on a spindle;

attaching said head to a linearly movable rotatable body having an axis of rotation so that said axis of rotation extends through said area of interest of said head, said axis of rotation of said linearly movable rotatable body having a translational path, said translational path being radial with respect to said test disk;

positioning said head at said desired radial position near said flat surface of said test disk by imparting a specified linear displacement to said linearly movable rotatable body; and achieving said desired angular orientation of said head with respect to said flat surface of said test disk by rotating said linearly movable rotatable body through a specified angle.

14. The method recited in claim 13 wherein said test disk is selected from the group consisting of magnetic disks and transparent disks.

15. The method recited in claim 13 wherein said area of interest is a magnetic read/write element.

16. The method recited in claim 13 wherein said linearly movable rotatable body comprises a bearing mounted on a linear slide mechanism.

* * * * *